(12) United States Patent
Ishibashi et al.

(10) Patent No.: US 6,971,835 B2
(45) Date of Patent: Dec. 6, 2005

(54) VAPOR-PHASE EPITAXIAL GROWTH METHOD

(75) Inventors: Masayuki Ishibashi, Tokyo (JP); Takayuki Dohi, Tokyo (JP)

(73) Assignee: Sumitomo Mitsubishi Silicon Corporation, Tokyo (JP)

(*) Notice: Subject to any disclaimer, the term of this patent is extended or adjusted under 35 U.S.C. 154(b) by 0 days.

(21) Appl. No.: 10/323,676

(22) Filed: Dec. 20, 2002

(65) Prior Publication Data

US 2003/0119283 A1 Jun. 26, 2003

(30) Foreign Application Priority Data

Dec. 21, 2001 (JP) ............................. 2001-389779
Dec. 21, 2001 (JP) ............................. 2001-389780

(51) Int. Cl.[7] .............................................. B65C 49/07

(52) U.S. Cl. ...................... 414/609; 414/804; 414/785; 118/725; 118/730

(58) Field of Search .................. 118/730, 715, 725; 414/609, 804, 795, 941, 180, 805, 814, 935, 414/937; 438/478, 503, 507

(56) References Cited

U.S. PATENT DOCUMENTS

| | | | | |
|---|---|---|---|---|
| 3,783,822 A | * | 1/1974 | Wollam | |
| 4,846,102 A | * | 7/1989 | Ozias | ................... 118/730 |
| 5,267,607 A | * | 12/1993 | Wada | ................... 165/80.1 |
| 5,292,393 A | * | 3/1994 | Maydan et al. | ......... 156/345.32 |
| 5,542,559 A | * | 8/1996 | Kawakami et al. | ........... 216/67 |
| 6,293,749 B1 | * | 9/2001 | Raaijmakers et al. | ....... 414/609 |
| 2003/0119283 A1 | * | 6/2003 | Ishibashi et al. | ............ 438/478 |

* cited by examiner

*Primary Examiner*—Laura M Schillinger
(74) *Attorney, Agent, or Firm*—Kubovcik & Kubovcik

(57) ABSTRACT

A single opening is formed in a central portion of a susceptor of a vapor phase epitaxial growth system. Consequently, any dopant diffused off outwardly from the back surface of a wafer during an epitaxial growth process can be exhausted through the opening to the beneath side with respect to the susceptor. As a result, it may become difficult for auto-doping to be induced, even with no protective film formed on a back surface of the wafer. Uniformity in a dopant concentration in the surface may be improved and thus a resistivity may be made uniform. Further, since a temperature of the back surface of the wafer is measured through the opening, a heating temperature can be controlled stably, thus allowing a precise temperature control thereof. Consequently, the epitaxial film as well as the distribution of its resistivity may be made uniform across the entire wafer.

4 Claims, 7 Drawing Sheets

VAPOR-PHASE EPITAXIAL GROWTH METHOD

BACKGROUND OF THE INVENTION

In recent years, such an epitaxial wafer is employed as a silicon wafer for a MOS device, which has an epitaxial film formed on a top surface of silicon wafer added with a dopant of higher concentration thus achieving low resistivity, said epitaxial film added with a dopant of relatively lower concentration as compared to that of said silicon wafer. This epitaxial wafer provides an improved yield of a gate oxide film of the MOS device as well as many advantageous characteristics including a reduced parasitic capacity, a prevention of soft errors and an improved gettering performance.

In manufacturing such an epitaxial wafer, it has become difficult to handle the silicon wafer in a trend of increasing diameter with a prior art batch system in which a vapor phase epitaxial growth (hereinafter referred to as an epitaxial growth) is applied to a plurality of silicon wafers on all-at-once basis. For this reason, a vapor phase epitaxial growth system (hereinafter referred to as an epitaxial growth system) of single wafer processing type has been used commonly. Recently, such an epitaxial growth system tailored for a wafer of larger diameter has been also developed, which allows the epitaxial growth process to be applied to the wafer having the diameter equal to or greater than 300 mm.

This epitaxial growth system of single wafer processing type maybe classified into two different types. In one type of this system, a transferring and loading method applied between a conveying jig for conveying the wafer into/out of the system and a susceptor employs a Bernoulli chuck method or a method of moving up and down the conveying jig for transferring and loading the wafer. In other type of the system, the wafer is supported in its back surface by a pin and then the wafer may be transferred and loaded by an upward and downward movement of the pin.

In either type, basically, the wafer is loaded on a single susceptor arranged horizontally within the system, the wafer is heated to a high temperature by a heat source, such as an infra-red lamp, disposed in its surrounding, and then a reaction gas is introduced on the top surface of the heated wafer while rotating the susceptor, thereby allowing for the epitaxial growth of the epitaxial film on the top surface of the wafer.

A susceptor for the epitaxial growth, a vapor phase epitaxial growth system and a vapor phase epitaxial growth method according to the prior art will now be described with reference to FIGS. 7, 8 and 9.

As shown in FIGS. 7, 8 and 9, an epitaxial growth system (hereinafter referred to as the system) 1 has an epitaxial film deposition chamber (hereinafter referred to as a film deposition chamber) 2 within a reactor. That is, this film deposition chamber 2 is constituted of an upper dome 3, a lower dome 4 and a dome fitting unit 5. The upper dome 3 and the lower dome 4 are made of transparent material such as quartz. Further, the system 1 is configured such that a susceptor 10 and a silicon wafer W loaded thereon, each disposed within the film deposition chamber 2, may be heated by a plurality of halogen lamps (heating means) 6 disposed above and beneath the reactor of the system 1 respectively.

The susceptor 10 is fitted, in the outer periphery of its back surface, with and thus rotated by a support arm 8 connected to a susceptor revolving shaft 7. The susceptor 10 has employed a base material of carbon coated with a SiC film over the top surface thereof. This susceptor 10 may be a circular plate in shape or may be a circular plate having a concave portion as shown in FIG. 7, so that it can support the silicon wafer W by a face-to-face contact with the entire back surface of the silicon wafer W. This concave portion defines a pocket 10a formed by an approximately circular bottom wall and its surrounding side wall. Further, in the outer periphery of the susceptor 10, a total of three through holes 10b are formed as spaced by every 120 degrees along a circumferential direction. An elevator pin (an elevator member) 9 for moving up and down the silicon wafer W is inserted in each of those through holes 10b. The upward and downward movement of the elevator pin 9 is driven by a lift arm 11.

In dome fitting unit 5, a gas supply opening 12 and a gas exhaust opening 13 are disposed oppositely in those specific locations at a level facing against the susceptor 10. A reaction gas composed of Si source gas (base gas) such as $SiHCl_3$ gas, which has been diluted with hydrogen gas (a carrier gas) and further mixed with a small amount of dopant, is supplied into the film deposition chamber 2 from the gas supply opening 12 in parallel (horizontally) with the top surface of silicon wafer W. Thus supplied reaction gas flows through nearby the top surface of silicon wafer W and after having contributed to the epitaxial film growth processing, it is exhausted through the exhaust opening 13 to the outside of the system 1.

By the way, during this step of epitaxial growth processing, because an epitaxial growth process is carried out at high temperature, the dopant having been contained in the wafer (bulk) could be diffused toward the outside thereof during the epitaxial growth process and could induce such a phenomenon, what is called an auto-doping phenomenon, that the outwardly diffused dopant is then taken into the epitaxial film (especially into the outer periphery thereof). Due to this phenomenon, variations of the dopant concentration could occur in the formed epitaxial film surface, problematically resulting in that the resistivity of the epitaxial film in the outer periphery is lowered and thus causing uneven distribution of the resistivity over the surface. Especially when the epitaxial growth process is expected to form an epitaxial film containing the dopant of lower concentration as compared with that of silicon wafer W, such a problematic phenomenon could be observed that the dopant concentration in the epitaxial film rises in the outer periphery of the wafer W. As a result, there could be a region emerging, which has the dopant concentration in the epitaxial film that has fallen out of a predetermined specification, leading to a deteriorated yield of devices.

In order to prevent the uneven distribution of the resistivity within the epitaxial film surface resulting from the auto-doping, typically such a silicon wafer is used, which has been coated with a protective film entirely over the exposed back surface of the wafer, and/or excluding the part of the top surface of the wafer on which the epitaxial film should be formed, thereby inhibiting the auto-doping from silicon wafer W. As the protective film for preventing the auto-doping, generally a silicon oxide film by the CVD method is used, and in addition thereto, a poly-crystal silicon film that maybe formed on the back surface of the wafer for providing the gettering performance can also effectively work to prevent the auto-doping.

In this way, using the wafer having the protective film should be effective in inhibiting the auto-doping. However, this may require additionally its own dedicated equipment such as a CVD system or a processing process, and sometimes it may be required to provide a wafer having the protective film removed from the back surface, depending on the kind of a device process taken for fabricating the device on the epitaxial wafer. In the latter case, additional processes may also be required, including those for polishing and/or etching for removing the protective film after the epitaxial growth process. Owing to this, a cost for such an epitaxial wafer may be adversely increased, failing to meet the recent increasing demand for a low-price epitaxial wafer to be provided.

Under such circumstances, in order to solve the problems as stated above, one method has been suggested, in which, for example as shown in FIG. 8 and FIG. 9, a susceptor 10 having a number of through holes 10c formed over the entire surface of the bottom wall of the pocket 10a is used to carry out the epitaxial growth process. This configuration allows the dopant which has been diffused toward the outside from the back surface of the wafer to pass through the number of through holes 10c so as to be discharged to a lower region of the film deposition chamber 2. This can prevent the auto-doping.

By the way, a quality control of silicon wafer W places a high value on uniformity in the thickness of the epitaxial film and also uniformity of the distribution of its resistivity. To control them well, a temperature control in the reactor should be important. Referring again to FIG. 7, in specific, the temperature of silicon wafer W may be measured and based on thus measured temperature, the heating temperature by using the halogen lamps 6 may be accordingly controlled.

Also, such a radiation thermometer has been known as an instrument capable of measuring the temperature of the top surface of the wafer W in a non-contact manner without causing any contamination in silicon wafer W as well as the atmosphere within the film deposition chamber 2, which can measure an intensity of an infrared ray emitted from the heated wafer W by a pyrometer and determine the temperature based on the intensity of the infrared ray.

To control the temperature of the top surface of the wafer W, an upper radiation thermometer (a first temperature measuring means) 34 disposed above the film deposition chamber 2 measures the temperature of the top surface of the wafer W, and an upper heating control means 35 controls an upper halogen lamp (a first heating section) 6 so that the measured temperature may fall in a predetermined temperature range. On the other hand, to control the temperature of the back surface of the wafer W, a lower radiation thermometer (a second temperature measuring means) 37 disposed beneath the film deposition chamber 2 measures the temperature of the back surface of the wafer W, and a lower heating control means 38 controls a lower halogen lamp (a second heating section) 6 so that the measured temperature may fall in a predetermined temperature range.

However, if said susceptor 10 would be employed which has a plurality of through holes 10c distributed over almost entire area of the bottom wall of the pocket (FIG. 8 and FIG. 9), there could occur such a problem that since the susceptor 10 and silicon wafer W are rotated together as a one unit during the epitaxial growth process, the temperature of the back surface of the wafer W or the temperature of the susceptor 10, if measured by the lower radiation thermometer 37, may appear to be a partially varied temperature, thus preventing an accurate temperature control. This is because of a different emissivity between the main body of the susceptor 10 and silicon wafer W exposed through the through holes 10c.

SUMMARY OF THE INVENTION

An object of the present invention is to provide a vapor phase epitaxial growth method, which no more requires the protective film to be formed but can accomplish a reduced cost of an epitaxial wafer and further advantageously eliminate an effect of the auto-doping from the back surface of the wafer so as to improve uniformity in dopant concentration over an epitaxial film surface and thus to provide uniformity in resistivity.

Yet another object of the present invention is to provide a vapor phase epitaxial growth method, which enables a temperature of the back surface of the wafer to be measured accurately and thereby a precise control of a heating temperature of the wafer to be provided.

A first invention is characterized in vapor phase epitaxial growth method for growing an epitaxial film on a tops of a semiconductor wafer by using a susceptor for an epitaxial growth, said susceptor being configured to be a ring shape having a single opening formed in a central portion thereof as well as an outer periphery thereof functioning as a support section for supporting the semiconductor wafer.

A type of the semiconductor wafer may not be limited. For example, the semiconductor wafer may be a silicon wafer or a gallium arsenide wafer.

As a material to be used to make the susceptor for the epitaxial growth, for example, a carbon material and a SiC material maybe employed. Alternatively, the susceptor may employ a base material made of carbon material, which is then coated with a SiC film over the top surface thereof and the inner wall of the opening. This coating ensures that a contamination otherwise caused by the susceptor base material to be used, such as a carbon contamination from the susceptor base material, can be prevented.

According to the first invention, any dopant which has been diffused off outwardly from backside of the wafer during the epitaxial growth process can be exhausted through the opening in the central portion of the susceptor for the epitaxial growth to the beneath side with respect to that susceptor, thereby making it difficult for the dopant to be taken into the epitaxial film. Accordingly, even in carrying out the epitaxial growth without forming the protective film on the back surface of the semiconductor wafer, the effect of the auto-doping from the back surface of the wafer can be eliminated, thereby improving the uniformity in concentration of the dopant in the epitaxial film surface and thus providing such an epitaxial wafer having a uniform resistivity.

Preferably, the dopant discharged from the back surface of the wafer may be effectively exhausted to the outside of the reactor by forcing a purge gas, such as hydrogen, to flow to the back surface side of the susceptor for the epitaxial growth.

A second invention is characterized in vapor phase epitaxial growth method in accordance with the first invention, in which in said outer periphery of said susceptor for the epitaxial growth is formed a through hole into which an elevator member is inserted, said elevator member supporting and moving up and down the semiconductor wafer through said through hole.

The number of the through holes to be formed may be increased or decreased depending on the number of prepared elevator members.

A third invention is characterized in vapor phase epitaxial growth method performed by using a vapor phase epitaxial growth system, said system comprising: a reactor accommodating a susceptor for an epitaxial growth, said susceptor being configured to be a ring shape having a single opening formed in a central portion thereof as well as an outer periphery thereof functioning for supporting a semiconductor wafer, said reactor also allowing for a source gas to be introduced thereinto; and a heating means for increasing a reactor temperature in said reactor.

The vapor phase epitaxial growth system may be of single wafer processing type, in which the semiconductor wafers are applied on one-by-one basis to the epitaxial growth process. Alternatively, the system may be an epitaxial growth system of a batch processing type, in which a plurality of wafers are processed on all-at-once basis.

As the source gas, for example, $SiH_4$, $SiH_2Cl_2$, $SiHCl_3$ and $SiCl_4$ may be employed.

As the carrier gas, for example, a hydrogen gas and an inactive gas may be employed.

As the heating means, for example, a halogen lamp and an infrared lamp may be employed.

According to the third invention, the dopant, which has been diffused off outwardly from the backside of the semiconductor wafer during the epitaxial growth process while heating the semiconductor wafer within the reactor by the heating means, can be exhausted through the opening in the central portion of the susceptor for the epitaxial growth to the beneath side with respect to the back surface of the susceptor. This makes it difficult for the dopant to be taken into the epitaxial film. Accordingly, even in carrying out the epitaxial growth process without forming the protective film on the back surface of the semiconductor wafer, the effect of the auto-doping from the back surface of the wafer can be eliminated, thereby improving the uniformity in concentration of the dopant in the epitaxial film surface and thus providing such an epitaxial wafer having a uniform resistivity.

A fourth invention is characterized in vapor phase epitaxial growth method in accordance with the third invention, in which said vapor phase epitaxial growth system further comprises a first temperature measuring means for measuring a temperature of a top surface of the semiconductor wafer loaded on said susceptor for the epitaxial growth and a second temperature measuring means for detecting a temperature of a back surface of said semiconductor wafer or a temperature of said susceptor for the epitaxial growth at said outer periphery thereof with no through hole formed therein; and said heating means has a first heating section for increasing a temperature in the reactor from the top surface side of the semiconductor wafer loaded on said susceptor for the epitaxial growth, and a second heating section for increasing a temperature in the reactor from the back surface side of said semiconductor wafer.

The first and the second heating sections may be implemented by heaters of the same kind. Alternatively, different kinds of heaters may be used, for example, a halogen lamp as the first heating section and an infrared lamp as the second heating section.

A variety of contact type thermometers or a variety of non-contact type thermometers may be employed to implement the first measuring means and the second measuring means. Among them, as to the non-contact type thermometer, for example, a radiation thermometer may be employed.

According to the fourth invention, upon measuring the temperature of the back surface of the semiconductor wafer, the temperature may be measured through the opening formed in the central portion of the susceptor for the epitaxial growth. Alternatively, the temperature of the outer periphery of the susceptor may be measured. In the case where the through hole has been formed in the susceptor for the epitaxial growth, specifically in the vicinity of the through hole apart from the central portion of this susceptor, the temperature of the back surface of the susceptor and that of the back surface of the semiconductor wafer are measured alternately due to the rotation of this susceptor, and accordingly a difference in emissivity therebetween may inhibit the accurate temperature measurement. However, if the opening exists in the central portion of this susceptor, the effect of its rotation can be eliminated, so that the temperature of the back surface of the wafer can be measured precisely. Further, if in the susceptor for the epitaxial growth which supports the semiconductor wafer in contact with the entire surface of the outer periphery of the wafer, the temperature is measured in the back surface of the outer periphery thereof defined in a region including no through hole, the temperature of the back surface of the wafer can be measured accurately, though it is in an indirect manner. In this way, even with the susceptor having the through hole, the temperature of the back surface of the wafer can be measured precisely by choosing the central portion free from the effect by the rotation or the outer periphery including no through hole as a temperature measurement site. This may bring a favorable result in that the heating temperature control of the semiconductor wafer can be carried out in a precise and stable manner.

A fifth invention is characterized in an epitaxial growth method, comprising the steps of: loading a semiconductor wafer on a supporting section of a susceptor for the epitaxial growth, said susceptor accommodated in a reactor for a vapor phase epitaxial growth and configured to be a ring shape having a single opening formed in a central portion thereof as well as an outer periphery thereof functioning as a supporting section for supporting the semiconductor wafer; and while introducing a source gas into said reactor at a high temperature, allowing for the vapor phase epitaxial growth of a predetermined epitaxial film on a top surface of the semiconductor wafer.

According to the fifth invention, during the epitaxial growth process, any dopant which has been diffused off outwardly from inside of the wafer can be exhausted through the opening in the central portion of the susceptor to the beneath side of said susceptor. This makes it difficult for the dopant to be taken into the epitaxial film. As a result, even in carrying out the epitaxial growth without forming the protective film on the back surface of the semiconductor wafer, the effect of the auto-doping from the back surface of the wafer can be eliminated, thereby improving the uniformity in concentration of the dopant in the epitaxial film surface and thus providing such an epitaxial wafer having a uniform resistivity.

A sixth invention is characterized in a vapor phase epitaxial growth method in accordance with the fifth invention, further comprising the steps of: measuring a temperature of the top surface of said semiconductor wafer as well as measuring a temperature of the back surface of said semiconductor wafer through said opening of the susceptor; based on said measured temperature of the top surface of the semiconductor wafer, controlling the heating temperature within the reactor in the top surface side of the semiconductor wafer; and based on said measured temperature of the back surface of said semiconductor wafer, controlling the heating temperature within the reactor in the back surface side of the semiconductor wafer.

Upon measuring the temperature of the back surface of the wafer, the temperature may be measured through the opening formed in the central portion of the susceptor. This enables the temperature of the back surface of the wafer to be measured precisely without being affected by the rotation of the susceptor. Accordingly, it provides a stable heating temperature control and thus a precise temperature control for the semiconductor wafer.

DESCRIPTION OF THE PREFERRED EMBODIMENTS

An epitaxial growth method according to an embodiment of the present invention will now be described with reference to the attached drawings. In this regard, as a matter of course, the present invention is not limited to the illustrated embodiments.

Figure 1:
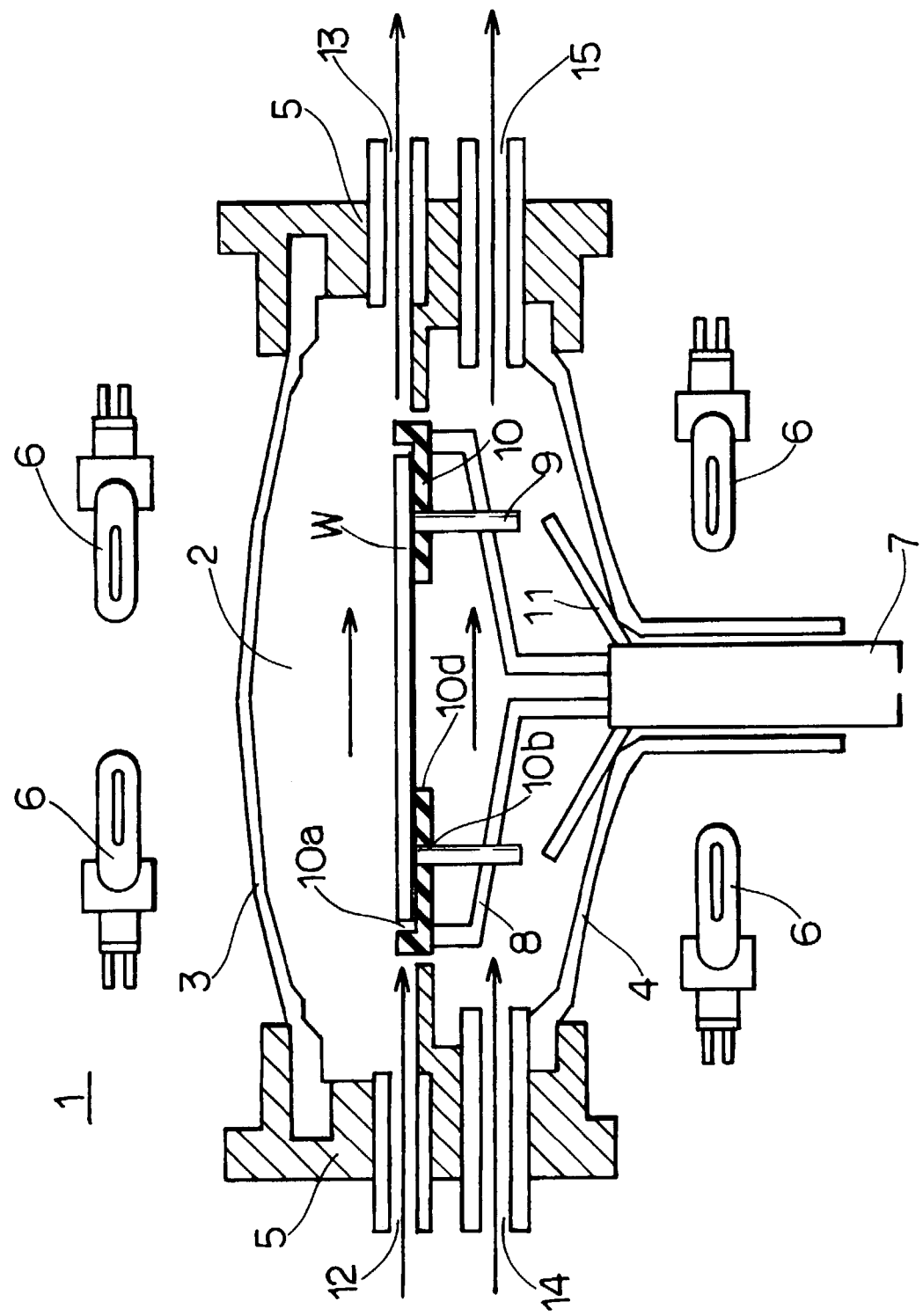
FIG. 1 is a sectional view showing schematically an epitaxial growth system in which is installed a susceptor for the epitaxial growth according to an embodiment of the present invention.
Figure 2:
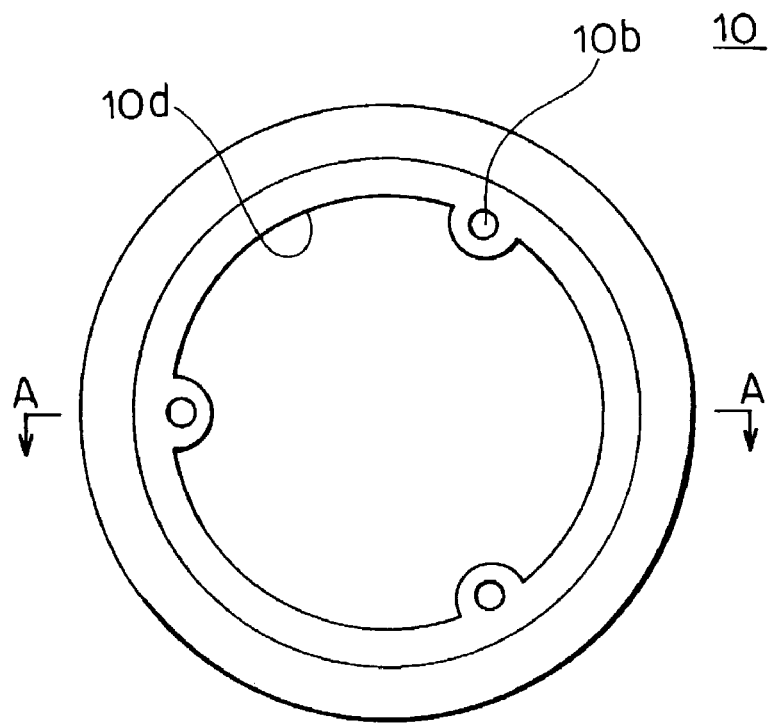
FIG. 2 is a plan view of the susceptor for the epitaxial growth according to an embodiment of the present invention.
Figure 3:
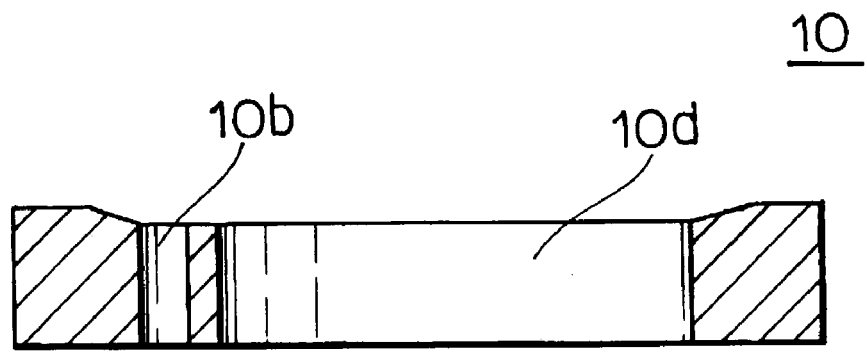
FIG. 3 is a sectional view taken along the A—A line of FIG. 2.

As shown in FIGS. 1, 2 and 3, an epitaxial growth system (hereinafter referred to as the system) 1 has an epitaxial film deposition chamber 2 within a reactor. This film deposition chamber 2 is constituted of an upper dome 3, a lower dome 4 and a fitting unit 5. Said upper and lower domes 3, 4 are made of transparent material such as quartz. Further, the system 1 is configured such that a susceptor 10 and a silicon wafer W may be heated by a plurality of halogen lamps (heating means) 6 disposed above and beneath the reactor of the system 1 respectively. The silicon wafer W to be used may be, for example, a P-type single crystal silicon wafer with one-face mirror polished, having a size of 200 mm in diameter and 740 m in thickness, a plane orientation of the top surface (100) and a resistivity of 15 m cm. No silicon oxide film (protective film) has been formed on the back surface of silicon wafer W and both the top and the back surfaces of the wafer have the single crystal silicon faces.

In dome fitting unit 5, a gas supply opening 12 and a gas exhaust opening 13 are disposed oppositely in those specific locations at a level facing against the susceptor 10. A reaction gas composed of Si source gas (base gas) such as $SiHCl_3$ gas, which has been diluted with hydrogen gas (a carrier gas) and further mixed with a small amount of dopant, is supplied into the film deposition chamber 2 from the gas supply opening 12 in parallel (horizontally) with the top surface of silicon wafer W. Thus supplied reaction gas flows through nearby the top surface of silicon wafer W and after having contributed to the epitaxial film growth processing, it is exhausted from the exhaust opening 13 to the outside of the system 1 (reactor).

Referring now to FIGS. 2 and 3, the susceptor 10 according to this embodiment will be described. It is to be noted that the present invention is not limited to the illustrated susceptor 10 at all.

The susceptor 10 is fitted, in an outer periphery of its back surface, with and thus rotated by a support arm 8 connected to a susceptor revolving shaft 7. This susceptor 10 has a pocket 10a defined by a circular bottom wall having a diameter of 215 mm, which is slightly larger than that of silicon wafer W, and a cylindrical side wall surrounding said bottom wall. The bottom wall and the side wall are made of carbon, respectively. Instead of carbon, they may be made of SiC. The silicon wafer W may be accommodated or loaded in this pocket 10a. It is to be noted that the size of the susceptor 10 may be appropriately determined corresponding to the diameter of silicon wafer W to be processed. The point is that the susceptor 10 is only required to have a gap in a range of 1 to 10 mm permitted between the circumferential edge of the bottom wall and the circumferential edge of the wafer W. Further, in the outer periphery of the bottom wall, a total of three through holes 10b are formed as spaced by every 120 degrees along a circumferential direction so as to be used for supporting and moving up and down silicon wafer W with pins. An elevator pin 9 for moving up and down silicon wafer W is inserted in each of those through holes 10b. Each of those elevator pins 9 is arranged so as to move up and down freely from the support arm 8. These elevator pins 9 are moved up and down by a plurality of lift arms 11, which are arranged along the susceptor revolving shaft 7 separately from the support arm 7 so as to be capable of moving up and down.

During the epitaxial growth process, the elevator pin 9 is inserted into and suspended through the through hole 10b. This means that the through hole 10b is substantially in a closed condition by the pin. Owing to this, the through hole 10b is almost unable to act as the through hole for discharging the dopant. It is to be appreciated that this through hole 10b provided for moving up and down the wafer is no more necessary in such an epitaxial growth system in which the wafer is transferred in the Bernoulli chuck method (FIG. 4), thus no need to provide the through hole in such a system.

Further, a single opening 10d is formed in a central portion of the bottom wall of the susceptor 10, for discharging the dopant which will be released from the back surface of silicon wafer W. In specific, the opening 10d is formed in a range defined by a diameter of 180 mm concentrically with the center point of the bottom wall. The diameter of the opening 10d is made smaller than that of silicon wafer W so as to prevent silicon wafer W loaded on the susceptor 10 from falling down.

Now, the epitaxial growth method by using an epitaxial growth system of single wafer processing type, in which this susceptor 10 has been installed, will be described.

At first, a CZ silicon wafer W, which has been mirror-polished in the top surface thereof in accordance with a known method, is loaded in the pocket 10a of the susceptor 10.

Then, silicon wafer W is subjected to a hydrogen gas bake processing at 1150 for 20 seconds, and then a mixed reaction gas, which is composed of SiHCl$_3$ representative of a silicon source gas and B$_2$H$_6$ representative of a boron source gas and diluted with the hydrogen gas, is introduced into the system 1 at a flow rate of 50 litter/min, so that a P-type epitaxial film having a thickness of about 6 m and a resistivity of 10 cm may grow on the top surface of the wafer at the epitaxial growth temperature of 1070.

The reaction gas supplied from the reaction gas supply opening 12 flows through the film deposition chamber 2, in which the susceptor 10 and silicon wafer W are heated by a plurality of halogen lamps 6 disposed above and beneath the system 1 respectively, and the gas, after having contributed to the epitaxial film deposition on the top surface of silicon wafer W, is exhausted through the gas exhaust opening 13 to the outside of the system 1.

As discussed above, the large opening 10d has been formed in the central region of the bottom wall. That is, after silicon wafer W having been loaded in that pocket 10a, the epitaxial growth process is carried out while supplying the reaction gas over the top surface side of the susceptor 10. At this moment, since no silicon oxide film for preventing the auto-doping has been formed on the back surface of the wafer W and accordingly both the top and the back surfaces of the wafer are constituted of silicon single crystal faces, the dopant (boron) is diffused off outwardly from the back surface of the wafer during the epitaxial growth process. However, this outwardly diffused dopant passes through the opening 10d formed in the central portion of the susceptor 10 so as to be discharged to the lower surface side of the susceptor 10. This makes it difficult for the dopant to be taken into the epitaxial film. As a result, even in carrying out the epitaxial growth process without forming the protective film on the back surface of the semiconductor wafer W, the effect of the auto-doping from the back surface of the wafer can be eliminated, thereby improving the uniformity in concentration of the dopant in the epitaxial film surface and thus providing such an epitaxial wafer having a uniform resistivity.

It is to be mentioned that the temperature of the susceptor 10 having the through holes may sometimes vary due to the rotation thereof when it is measured directly. In order to prevent this variation in the measurement, a dummy plate, though not shown, may be installed spuriously in a lower portion of the susceptor 10, and in that case, if the temperature of this dummy plate is measured and corrected so as to be used as a corrected value for the control, then the heating temperature of silicon wafer W can be controlled stably, thus allowing a precise temperature control thereof.

Alternatively, in the above operation, the temperature control of the top surface side of the wafer may be performed based on the measured value obtained by an upper radiation thermometer 34, while in the temperature control of the back surface side of the wafer W, an electric power determined from that for the top surface side multiplied by a coefficient, which has been experimentally determined, may be used for heating. The temperature measurement on the top surface by using the upper radiation thermometer 34 is free from the effect of the susceptor 10 having the through holes located in the back surface side of the wafer. That is, when the above configuration is employed, a lower radiation thermometer 37 for measuring the temperature of the back surface side of the wafer W may not be used but only the temperature of the top surface side of the wafer W may be measured, and in that case, based on that measured temperature of the top surface side, the electric power determined from that for the top surface side multiplied by the coefficient, which has been experimentally determined, may be employed to control the heating temperature for the back surface side of the wafer W. This may accomplish the uniformity in thickness of the epitaxial film and also the uniform distribution of the resistivity over the film surface.

Figure 4:
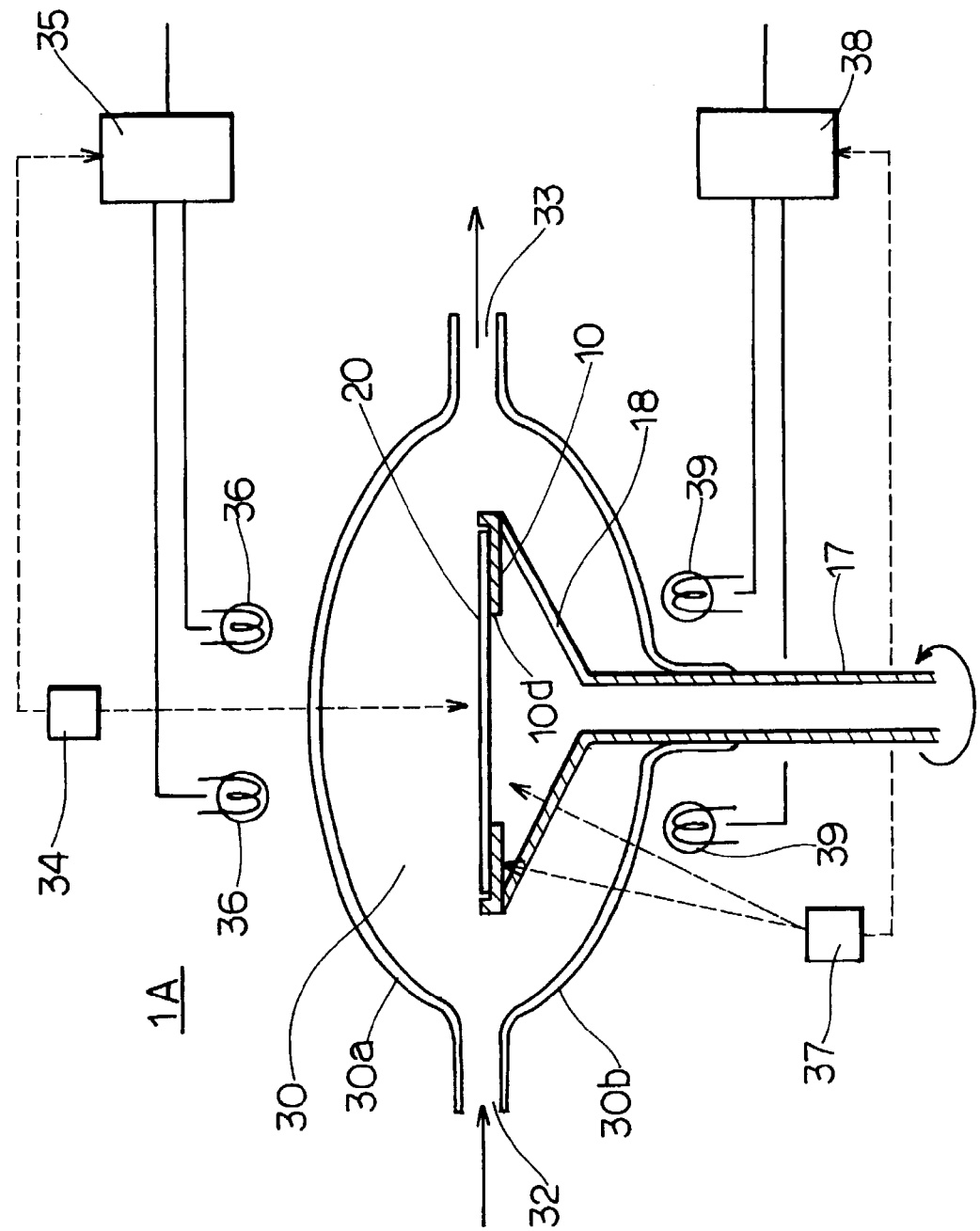
FIG. 4 is a sectional view showing schematically an epitaxial growth system in which is installed a susceptor for the epitaxial growth according to another embodiment of the present invention.

Referring now to FIG. 4, another embodiment according to the present invention will be described. This embodiment employs an epitaxial growth system 1A (hereinafter referred to as the system 1A) of single wafer processing type in which a Bernoulli chuck method is used for conveying a wafer.

A film deposition chamber 30 formed within the system 1A is constituted of an upper dome 30a and a lower dome 30b, which together define a reactor. Said upper and lower domes 30a, 30b are made of transparent material such as quartz, such that a susceptor 10 and a silicon wafer 20 may be heated by a plurality of infrared ray type heating lamps (a first heating means) 36 disposed above the system 1A and a plurality of infrared ray type heating lamps (a second heating means) 39 disposed beneath the system 1A. The susceptor 10 is fitted, in its outer periphery of the lower surface, with and rotated by a support arm 18 connected to the susceptor revolving shaft 17.

A reaction gas composed of Si source gas such as SiHCl$_3$, which has been diluted with hydrogen gas and further mixed with a small amount of dopant, is supplied from a reaction gas supply unit, though not shown, into the reactor 30 through the gas supply opening 32, and thus supplied reaction gas flows over the top surface of the wafer 20, thereby forming an epitaxial film thereon, while the gas, which has not reacted, is exhausted through the reaction gas exhaust opening 33 to the outside of the system.

An upper radiation thermometer 34 is provided above the upper dome 30a for measuring a temperature of the top surface of the wafer, and a signal indicative of a measured temperature is entered into an upper heat controller 35. The upper heat controller 35 controls an electric power to be supplied to the upper infrared lamps 36 from a power supply source, though not shown, based on the measured value by the upper radiation thermometer 34 so that the temperature of the top surface of the wafer may fall in a predetermined temperature range.

A lower radiation thermometer 37 is provided beneath the lower dome 30b for measuring a temperature of the back surface of the wafer or a temperature of the susceptor 10 in a region of the outer periphery where no through hole is formed, and a signal indicative of a measured temperature is entered into a lower heat controller 38. The lower heat controller 38 controls an electric power to be supplied to the lower infrared lamps 39 from a power supply source, though not shown, based on the measured value by the lower radiation thermometer 37 so that the temperature of the back surface of the wafer may fall in a predetermined temperature range.

As discussed above, the upper heat controller 35 and the lower heat controller 38 respectively measure and control the temperatures of the top and the back surfaces of the silicon wafer W independently from each other, by using the upper radiation thermometer 34 and the lower radiation thermometer 37. Owing to this operation, the wafer can maintain its predetermined temperature in a proper manner and thus the uniform epitaxial film can be obtained.

Other configuration, operation and effect of this embodiment are almost similar to those of the previously described embodiment, and so a duplicated description should be omitted.

A comparison will be reported herein between a result from a subject example in accordance with the embodiment of the present invention and a result from a comparison example in accordance with a prior art.

Figure 7:
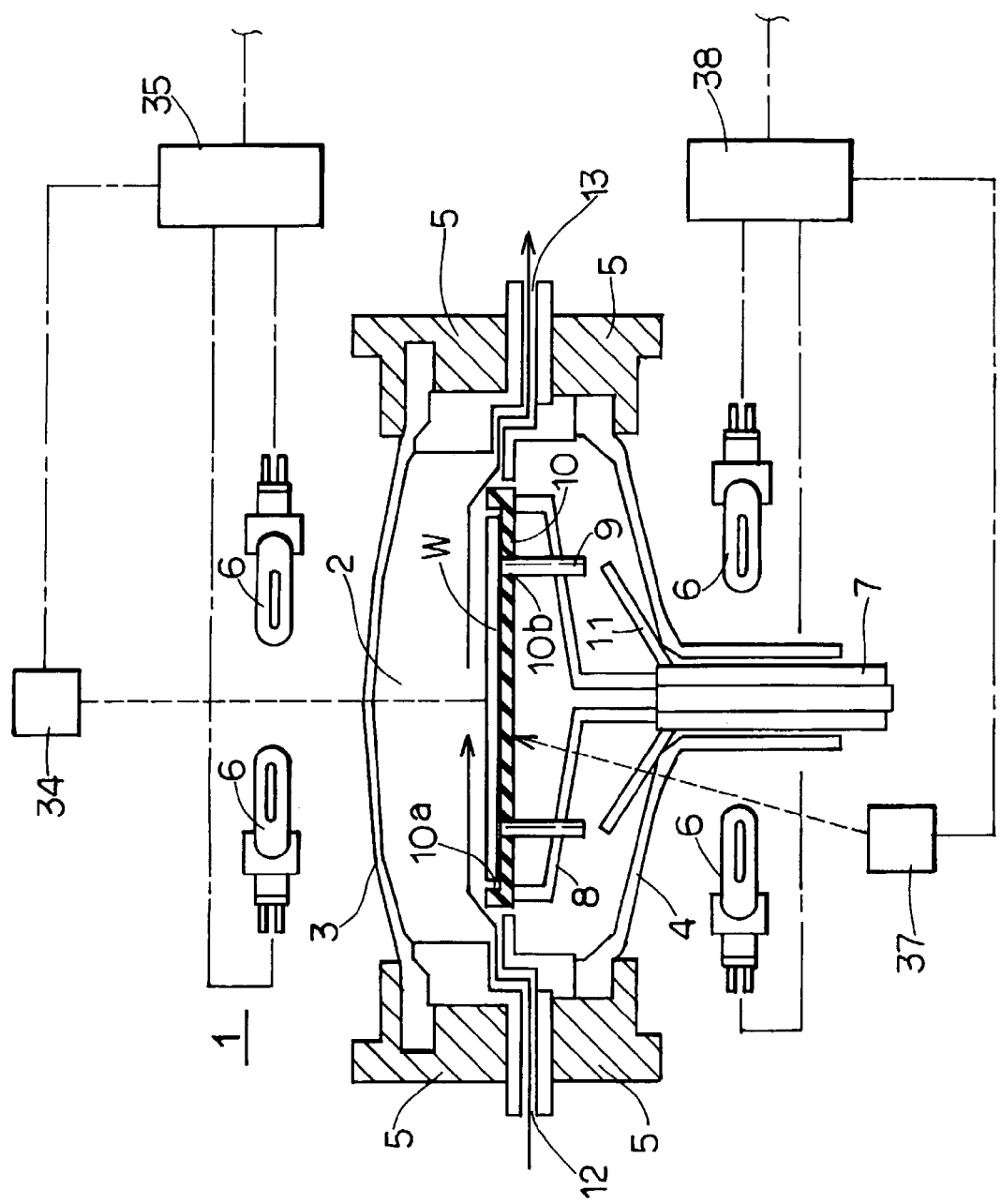
FIG. 7 is a sectional view showing schematically an epitaxial growth system according to a prior art.
Figure 8:
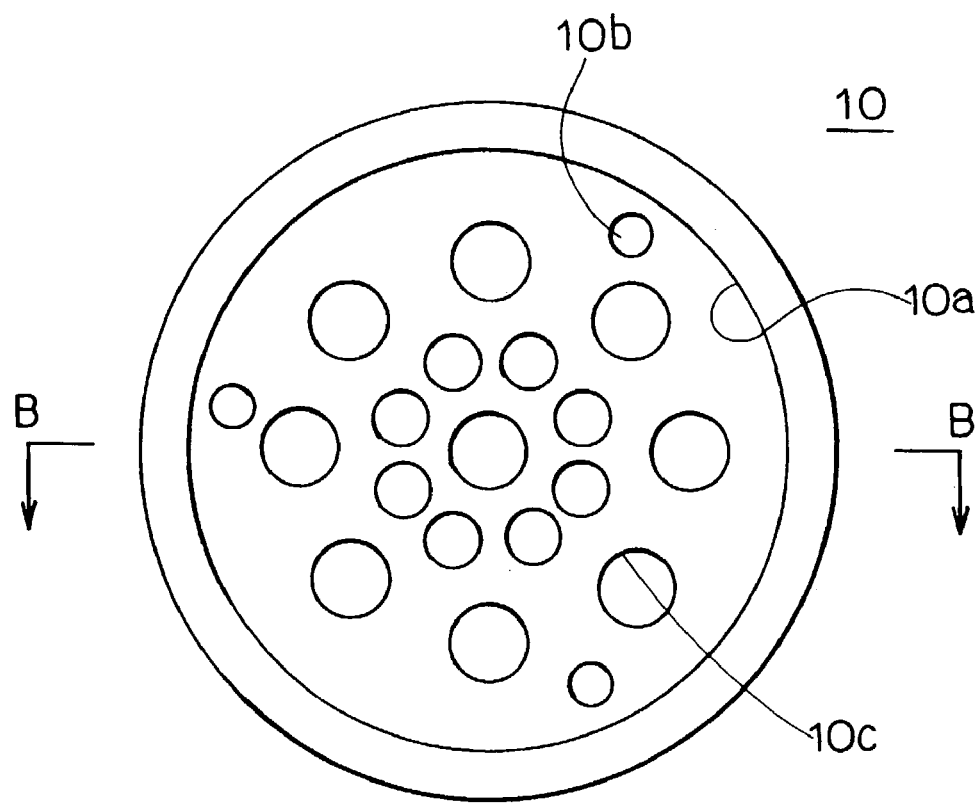
FIG. 8 is a plan view showing schematically a susceptor for the epitaxial growth according to a prior art.
Figure 9:
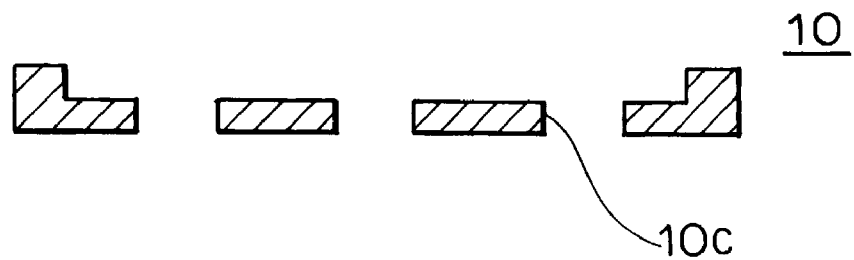
FIG. 9 is a sectional view taken along the line B—B of FIG. 8.

In the comparison example, similarly to the subject example of the present invention, a single wafer processing type epitaxial growth system as shown in FIG. 1 was used, and the hydrogen gas was supplied from the gas supply opening 14 at a flow rate of 17 litter/min from the viewpoint of preventing the silicon deposition onto an internal member of the reactor, such as the revolving shaft 7 of the susceptor 10, located beneath the film deposition chamber 2. As the susceptor 10, a prior art susceptor as shown in FIG. 7 was used in this example for carrying out an epitaxial growth process.

Figure 5:
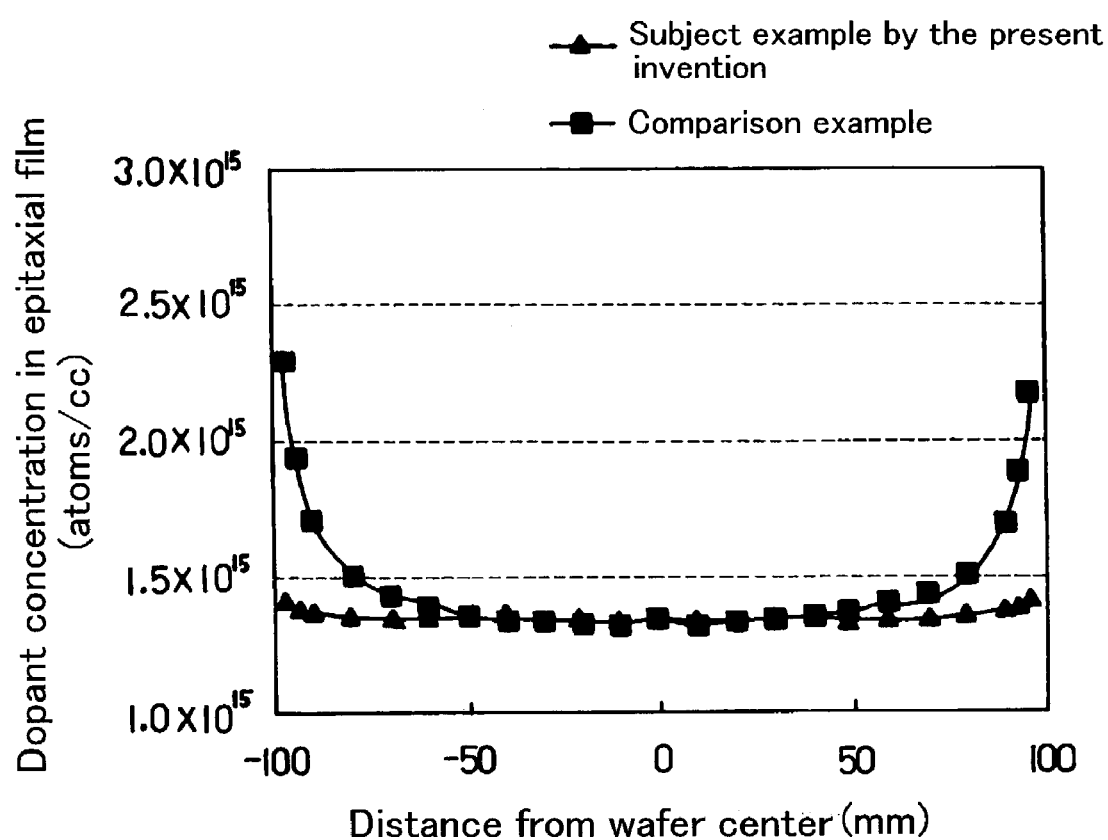
FIG. 5 is a graph illustrating a distribution of a dopant concentration measured in an epitaxial film in an epitaxial wafer along a radial direction, obtained for a subject example by the present invention and a comparison example.
Figure 6:
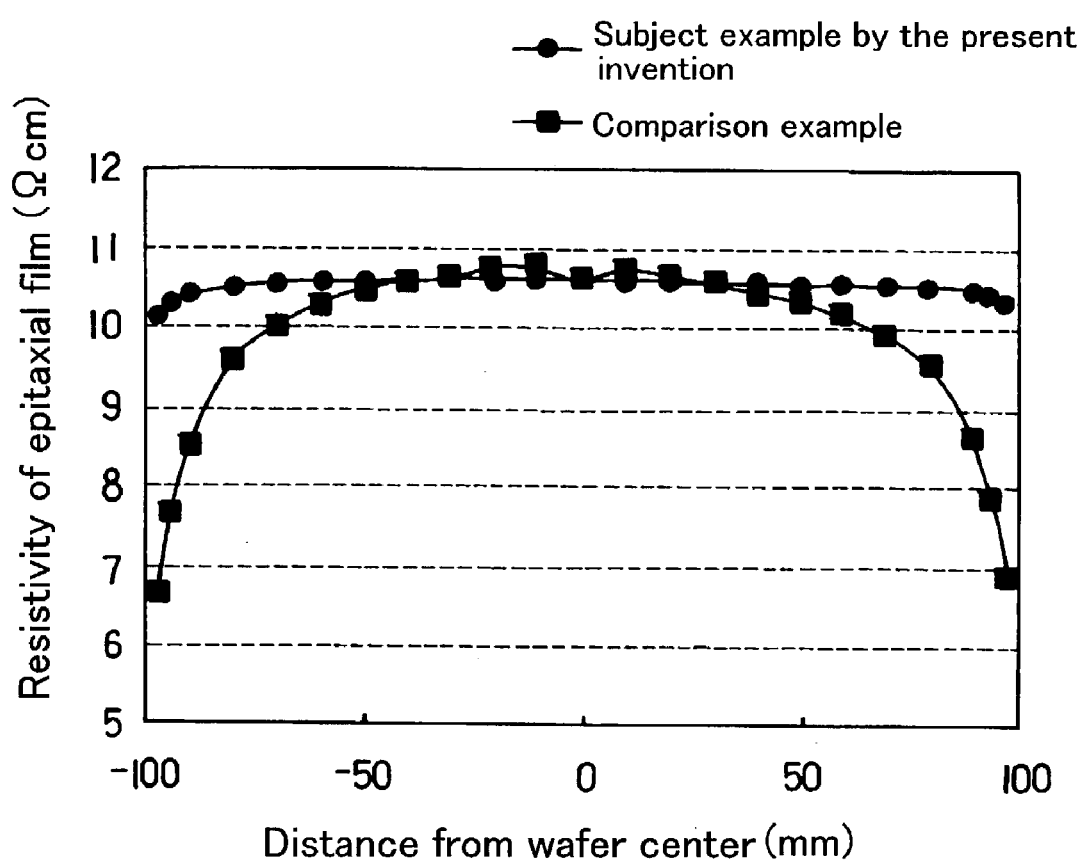
FIG. 6 is a graph illustrating a distribution of a resistivity measured in an epitaxial film in an epitaxial wafer along a radial direction, obtained for a subject example by the present invention and a comparison example.

For each of those different epitaxial silicon wafers obtained in the example according to the present invention and the comparison example, a distribution of a concentration of the dopant in the epitaxial film along the radial direction, excluding a region within 3 mm from the outer peripheral edge, was measured by using SCP equipment (Surface Charge Profiler). The results are shown in FIG. 5. Also, a distribution of the resistivity in the epitaxial film determined along the radial direction obtained from the above measured results is shown in FIG. 6 for each example. FIG. 5 is a graph showing the distribution of the dopant concentration in the epitaxial film along the radial direction in each of the epitaxial wafers obtained in the subject example and the comparison example, while FIG. 6 is a graph showing the distribution of the resistivity in the epitaxial film along the radial direction in each of the epitaxial wafers obtained in the subject example and the comparison example.

As clearly seen from FIGS. 5 and 6, in the subject example according to the present invention, the dopant concentration in the epitaxial film indicates that the dopant was taken into the film uniformly and such a P-type epitaxial film satisfying a targeted resistivity of 10 cm was obtained. In contrast to this, in the comparison example, the dopant concentration is observed high in the outer periphery and the distribution of its resistivity significantly dropped in the outer periphery.

As set forth above, according to the present invention, since such a susceptor is used that has a single opening in a central portion, an epitaxial growth may be carried out while preventing the auto-doping.

Accordingly, the uniformity of the dopant concentration within the epitaxial film surface may be improved and thereby evenness in resistivity thereof may be provided. Further, the formation of a protective film for preventing the auto-doping to the back surface is of the wafer, which has been generally required in the prior art, and thus the equipment and processing processes dedicated for the protective film formation are no more necessary in the present invention. In addition, the process for removing the protective film after the epitaxial growth process can be eliminated also. Accordingly, the present invention can reduce a manufacturing cost of the epitaxial wafer and meet the increasing demand for a low-price epitaxial wafer to be provided.

Further, in the present invention, since upon measuring a temperature of the back surface of a semiconductor wafer loaded on the susceptor, the temperature of the back surface of the wafer may be measured through the opening in the central portion of the susceptor, which is free from any affection otherwise caused by the rotation of the susceptor, an accurate temperature measurement of the back surface of the wafer can be provided. Consequently, the present invention can provide the uniformity of the epitaxial film as well as the uniformity in the resistivity distribution across the entire wafer.

What is claimed is:

1. A vapor phase epitaxial growth method for growing an epitaxial film on a top surface of a semiconductor wafer, comprising the steps of:
    accomodating a susceptor for an epitaxial growth in a reactor for a vapor phase epitaxial growth, said susceptor configured to be a ring shape having a single opening formed in a central portion thereof as well as an outer periphery thereof functioning as a supporting section for supporting a semiconductor wafer;
    loading the semiconductor wafer on said supporting section of the susceptor for the epitaxial growth; and
    while exposing a bottom surface of the semiconductor wafer through the single opening in said susceptor, allowing for the vapor phase epitaxial growth of the epitaxial film on the top surface of said semiconductor wafer by increasing a temperature in said reactor and introducing a source gas into said reactor.

2. The vapor phase epitaxial growth method according to claim 1, further comprising:
    measuring a temperature of the top surface of the semiconductor wafer and, based on said temperature, controlling the temperature within the reactor on the top surface side of the semiconductor wafer; and
    measuring a temperature of a back surface of the semiconductor wafer through said single opening of the susceptor or measuring a temperature of a back side of the susceptor and, based on said temperature of a back surface of the semiconductor wafer or said temperature of a back side of the susceptor, controlling the temperature within the reactor on the bottom surface side of the semiconductor wafer.

3. The vapor phase epitaxial growth method according to claim 1, further comprising:
    measuring a temperature of the top surface of the semiconductor wafer;
    measuring a temperature of a back surface of the semiconductor wafer through said single opening of the susceptor or measuring a temperature of a back side of the susceptor; and
    controlling the temperature inside of the reactor based on the temperatures measured on the top surface of the semiconductor wafer and on the back surface of the semiconductor or the back side of the susceptor.

4. The vapor phase epitaxial growth method according to claim 1, further comprising:
    measuring a temperature of the top surface of the semiconductor wafer and, based on said temperature, separately controlling the temperature of the top surface side of the semiconductor wafer and the temperature of the bottom surface side of the semiconductor wafer.

* * * * *